United States Patent [19]

Verbanets

[11] Patent Number: 4,937,769
[45] Date of Patent: Jun. 26, 1990

[54] APPARATUS AND METHOD FOR REDUCING TRANSIENT EXPONENTIAL NOISE IN A SINUSOIDAL SIGNAL

[75] Inventor: William R. Verbanets, Plum Borough, Pa.

[73] Assignee: ASEA Brown Boveri Inc., Purchase, N.Y.

[21] Appl. No.: 207,354

[22] Filed: Jun. 15, 1988

[51] Int. Cl.$^5$ .............. G06F 15/56; G01R 19/00; H03F 1/26

[52] U.S. Cl. .................. 364/574; 328/165; 364/483; 364/492

[58] Field of Search ........... 364/483, 492, 574, 724.01, 364/724.19; 328/162, 163, 165; 361/80

[56] References Cited

U.S. PATENT DOCUMENTS

| | | | |
|---|---|---|---|
| 4,322,641 | 3/1982 | Packard | 364/574 |
| 4,455,612 | 6/1984 | Girgis et al. | 364/483 |
| 4,577,279 | 3/1986 | Salowe | 364/483 |
| 4,587,620 | 5/1986 | Niimi et al. | 364/724.01 |
| 4,646,254 | 2/1987 | O'Connor et al. | 364/574 |
| 4,684,989 | 8/1987 | Roeder et al. | 364/574 |
| 4,694,414 | 9/1987 | Christopher | 364/724.1 |
| 4,727,504 | 2/1988 | Van Broekhoven | 364/724.01 |
| 4,795,983 | 1/1989 | Crockett et al. | 364/483 |

OTHER PUBLICATIONS

Unified Protection, Monitoring, and Control of Overhead Transmission Line Achieves Performance and Economy, Edmund O. Schweitzer, III Phd, Schweitzer Engineering Laboratories, Pullman, Wash.

Alternating Current Circuits, Russell M. Kerchner, M.S. et al., Second Edition, New York, Chapter 16, John Wiley & Sons, Inc.

*Primary Examiner*—Kevin J. Teska
*Attorney, Agent, or Firm*—B. R. Studebaker

[57] ABSTRACT

The offset in digital samples of the voltages and currents in a power transmission system following a fault is reduced by subtracting a linear approximation of the exponential component of the transient from the magnitude of the samples to extract the sinusoidal component. The slope and initial ordinate value of the linear approximation are derived from simple calculations using pairs of digital samples spaced one-half cycle apart. Compensated values of the digital samples for the first half cycle of the transient are produced within one-half cycle plus one additional sampling interval from fault inception.

6 Claims, 2 Drawing Sheets

APPARATUS AND METHOD FOR REDUCING TRANSIENT EXPONENTIAL NOISE IN A SINUSOIDAL SIGNAL

BACKGROUND OF THE INVENTION

1. Field of the Invention

This invention relates to an apparatus and method which reduces transient exponential noise in sinusoidal signals and has particular application in reducing such noise in the signals processed by protective relays in an electric power transmission system. More specifically, the invention is directed to an apparatus and method which approximates the noise as a linear function and extracts the slope and initial ordinate value of that approximate linear function from sets of digital samples of the composite signal one-half cycle apart.

2. Background Information

Step changes in electrical circuits having reactive components fed by sinusoidal currents create transient responses which make it difficult to initially determine the new steady state conditions. One application where this phenomenon has particular significance is in protective relays used to protect electric power generating equipment, transmission lines, and transformers from destruction during fault conditions. These relays monitor the power line voltages and currents and make decisions based upon the values and relationships of the inputs. The decision making process is complicated by the presence of a decaying exponential current waveform during the first few cycles of the fault current, just when the protective relays must perform their function.

The presence of such transients in many instances is accommodated for by the use of conservative margins in the decision making process. For instance, in distance measuring relays which calculate the apparent impedance to a fault from the relay by dividing the measured voltage by the current to determine if the fault is within the protection zone of the relay, the reach characteristic with which the apparent impedance is compared is adjusted to take the transient into account. This reduces the accuracy of the calculation, however.

U.S. Pat. No. 4,577,279 discloses a technique for reducing the exponential transient noise in the signals used by a fault locator. This technique recognizes that the transient can be resolved into the sinusoidal power component and a decaying exponential and that if the signal is averaged over a full cycle, the sinusoidal component is eliminated. Based upon the assumption that the average value of the exponential occurs near the midpoint of the cycle, a running average of digital samples for the last full cycle is maintained and is subtracted from the value of the sample at the midpoint to determine the compensated digitized value of the sinusoidal signal at that point. A new running average is calculated for each new sample. The difficulty with this technique is that a complete power cycle is required to obtain the first compensated value and two full cycles are required to obtain a full compensated cycle of the sinusoidal signal. This delay is acceptable in applications like fault location, but is unacceptable in making trip decisions.

In another technique for removing a transient from a sinusoidal signal, samples are taken asynchronously one-quarter of the power cycle apart with the first and fourth samples being added and the second and third being subtracted. This digital filter removes the dc and ramp components leaving only higher order terms of the exponential transient which are said to be insignificant. One difficulty with this technique is that it requires one full cycle before compensated values are available. It is also not compatible with the use of a Fourier algorithm for deriving the sinusoidal signal from digital samples which requires a higher sampling rate for suitable accuracy.

There remains a need, therefore, for an improved method and apparatus for reducing transient exponential noise in a sinusoidal signal. More particularly, there remains a need for such a method and apparatus which is rapid and provides compensated data at a rate which can be used with a notch filter employing a Fourier algorithm for deriving the sinusoidal signal from digital samples.

SUMMARY OF THE INVENTION

These and other needs are satisfied by the invention which derives compensated values of the currents and voltages directly from digital samples of the waveforms using simple numerical calculations, and provides such compensated values from the beginning of the transient within one-half cycle of transient initiation plus one additional sample interval.

This rapid compensation is made possible by deriving a linear approximation of the exponential component of the transient signal and subtracting the value of this linear approximation from each of the digital samples to determine the value of the sinusoidal component.

More particularly, a plurality of digital samples of the instantaneous magnitude of the transient waveform are generated asynchronously at instants spaced by equal intervals of time during each cycle of the waveform. Since the value of the sinusoidal component of the transient at instants separated by one-half cycle are equal and opposite, this component can be eliminated by adding the magnitudes of samples one-half cycle apart. The task remains to determine the slope and initial ordinate value of the linear approximation of the exponential component.

The slope of the linear approximation of the exponential component of the transient is determined in a microprocessor by adding the magnitudes of each of a first pair of digital samples for instants spaced from each other by one-half cycle of the waveform to produce a sum, subtracting from this sum the magnitude of each of a second pair of digital samples also one-half cycle apart and spaced from a corresponding one of the first pair of digital samples by a preselected number, preferably one, of the intervals to produce a result. The result is divided by minus twice the time between corresponding digital samples in the first and second pair of digital samples to arrive at the slope.

The initial ordinate value of the linear approximation of the exponential component of the transient is determined by calculating the average of the magnitudes of the first pair of digital samples and adding to that average the sum of the magnitudes of the first pair of digital samples minus the sum of the magnitudes of the second pair of samples divided by the number of intervals between corresponding samples in the first and second pairs of samples.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENT

I. Fundamental Principles

It is known that the resultant current waveform in an ac power transmission system following a fault can be analyzed as comprising a steady-state sinusoidal component and an exponential component. This analysis can also be applied to other electrical circuits having an inductive load. An excellent explanation of the source and characteristics of this transient phenomenon is presented in Chapter 16 of "Alternating Current Circuits" by Russell Kerchner and George Corcoran, John Wiley & Sons, New York, Second Edition, 1948.

The fault current equation is given by:

$$i = \frac{E_m}{Z} \sin(\omega t + \lambda - \theta) - \frac{E_m}{Z} \sin(\lambda - \theta)e - \frac{R_t}{L} \quad \text{Eq. (1)}$$

Where $\lambda$ is the angular displacement between the voltage zero crossing and $t=0$ (fault inception), R and L are the lumped parameter resistance and inductance of the transmission line, $E_m$ is the amplitude of the 60 Hz voltage source, and $$Z = \sqrt{R^2 + \omega^2 L^2} \quad \text{Eq. (2)}$$

and $$\theta = \tan^{-1}\left(\frac{\omega L}{R}\right) \quad \text{Eq. (3)}$$

The first term of equation (1) represents the sinusoidal component and the second represents the exponential component, also referred to as the offset.

Figure 1:
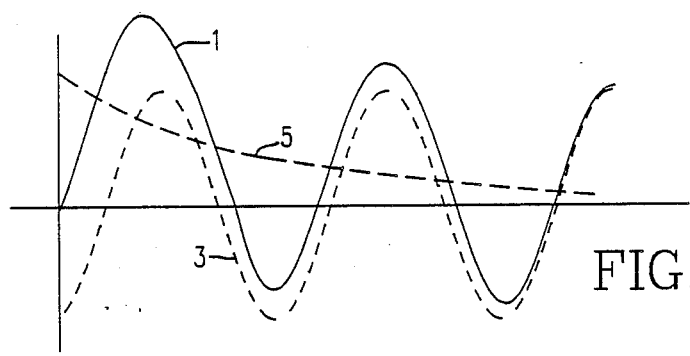
FIG. 1 is a waveform diagram illustrating the sinusoidal and exponential components of a sinusoidal waveform containing transient exponential noise.

An illustration of these components is shown in FIG. 1 where the resultant transient waveform 1 is resolved into the steady-state sinusoidal component 3 and the exponential component 5.

The present invention is directed to apparatus and a technique to reduce the effect of the exponential term using digital sampling of the waveform. The invention assumes that the waveform is digitized and input to a microprocessor. It is further assumed that the sampling is uniform and asynchronous with respect to the waveform.

Figure 2:
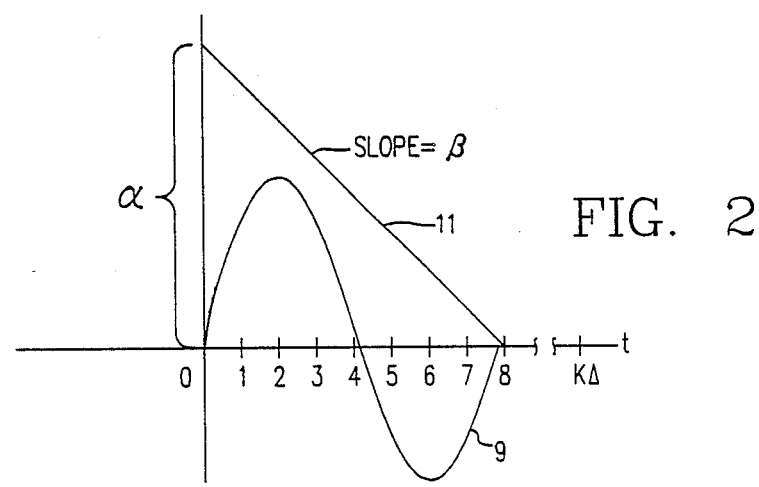
FIG. 2 is a waveform diagram illustrating the technique in accordance with the invention of approximating the exponential component of the waveform of FIG. 1 as a linear function.

The key to the invention is to approximate the exponential component of the transient as a linear equation in any given cycle of fault data, as illustrated in FIG. 2 where 9 represents the sinusoidal term and 11 represents the straight line approximation of the exponential term. The well known equation for such a straight line is:

$$i_{ex} = \alpha + \beta t \quad \text{Eq. (4)}$$

The constants $\alpha$ and $\beta$ in this equation are the initial ordinate value and slope respectively of the line 11. The values of these constants are determined from the digital samples of the waveform using a special algorithm. Once the linear approximation is found, it is subtracted from the input samples. The end result is a set of compensated samples with the offset removed.

The waveform is sampled a number of times during each cycle at instants spaced by equal intervals of time, $\Delta$. By way of example, the waveform may be sampled eight times per cycle as indicated in FIG. 2. While the initial sample is shown in FIG. 2 as being taken at the zero crossing of the sinusoidal term, this is for illustration only, and as mentioned, the sampling is asynchronous with the sinusoidal component. It is also assumed that the exponential term 11 is continuous over the period of the sine wave; this is, that it is present the entire time.

Since the waveform 1 is sampled every $\Delta$, equation (4) can be rewritten as:

$$i_{ex} = \alpha + \beta K \Delta \quad \text{Eq. (5)}$$

Where $K=0, 1, \ldots, 7$. Assuming the waveform represents a current input, the sample at $K=0$ is given by:

$$\hat{i}(0) = i(0) + \alpha + \beta (0 \cdot \Delta) \quad \text{Eq. (6)}$$

where $i(0)$ is the sinusoidal term and the remainder is the linear term and $\hat{i}(0)$ in the total current.

Similarly, the sample at $K=4$, one-half cycle after the sample $K=0$, is given by:

$$\hat{i}(4) = i(4) + \alpha + \beta(4\Delta) \quad \text{Eq. (7)}$$

Now, equations 6 and 7 are added to yield:

$$\hat{i}(0) + \hat{i}(4) = i\text{Io})(0) + i(4) + 2\alpha + 4\beta\Delta \quad \text{Eq. (8)}$$

But $i(0) = -i(4)$ since sine wave samples one-half cycle apart are equal and opposite in value. Hence, equation (8) reduces to:

$$\hat{i}(0) + \hat{i}(4) = 2\alpha + 4\beta\Delta \quad \text{Eq. (9)}$$

Since equation 9 contains two unknowns, the process is repeated for another pair of samples, $K=1$ and $K=5$, one-half cycle apart, to yield.

$$\hat{i}(1) + \hat{i}(5) = 2\alpha + 6\beta\Delta \quad \text{Eq. (10)}$$

If equation (9) is designated $i(04)$ and equation (10) is identified as $i(15)$:

$$i(04) - i(15) = 2\alpha + 4\beta\Delta - 2\alpha - 6\beta\Delta \quad \text{Eq. (11)}$$

Solving for $\beta$ yields:

$$\beta = \frac{i(04) - i(15)}{-2\Delta} = -\frac{1}{2\Delta}(i(0) + i(4) - \hat{i}(1) - i(5)) \quad \text{Eq. (12)}$$

Equation (12) is solved directly from the four digital samples $\hat{i}(0)$, $\hat{i}(1)$, $\hat{i}(4)$ and $\hat{i}(5)$.

After $\beta$ is found, $\alpha$ may be found by solving equation (9) for $\alpha$:

$$\alpha = i(04)/2 - 2\beta\Delta = 3/2(\hat{i}(0) - \hat{i}(4)) - \hat{i}(1) - \hat{i}(5) \quad \text{Eq. (13)}$$

Equation (13) is also solved directly from four samples î(0), î(1), î(4) and î(5). Eq. (14)

With $\alpha$ and $\beta$ defined for this fault cycle, the compensated current samples are found by the following equation.

$$i(K) = \hat{i}(K) - \alpha - \beta(K\Delta) \qquad \text{Eq. (15)}$$

A generalized equation for $\beta$ is as follows:

$$\beta = \frac{\hat{i}(K) + \hat{i}\left(K + \frac{n}{2}\right) - \hat{i}(K + x) - \hat{i}\left(K + \frac{n}{2} + X\right)}{2\Delta} \qquad \text{Eq. (16)}$$

Where X equals the number of intervals, $\Delta$, between corresponding samples in the two pairs of digital samples each of which are one-half cycle apart and n equals the number of samples per cycle.

Similarly, the generalized equation for $\alpha$ is:

$$\alpha = \frac{\hat{i}(K) + \hat{i}\left(K + \frac{n}{2}\right)}{2} + \frac{\hat{i}(K) + \hat{i}\left(K + \frac{n}{2}\right) - \hat{i}(K + X) - \hat{i}\left(K + \frac{n}{2} + X\right)}{X} \qquad \text{Eq. (17)}$$

Equation 17 determines $\alpha$ at the first sample.

The effectiveness of this technique for eliminating the offset transient in the computation of the rms values of the fault current, is illustrated by the following example where:

$$\hat{i} = \sin\left(\frac{2\pi K}{8}\right) + e^{\frac{k}{8}} \qquad \text{Eq. (18)}$$

This fault current has a one cycle exponential offset. Without any compensation, the rms value of the current over one cycle is calculated to be 1.08. With compensation in accordance with the invention, the rms value is 0.677. The correct answer is 0.7071. Thus, without compensation, the error is 53%. With compensation, it is −4%.

II. Application to Distance Measuring Relay

As mentioned previously, distance measuring relays calculate the apparent impedance to a fault from the current and voltage, and compare it with a reach characteristic to determine if the fault is within the protection zone of the relay. These impedance calculations are obviously affected by transient exponential noise in the current and voltage waveforms. Clearly, the accuracy of the impedance calculations can be improved by a technique which eliminates this offset. It is imperative, however, that the offset be determined rapidly since in many instances the relay must make a trip decision quickly after fault inception. The present invention provides a rapid method of eliminating the offset with good accuracy.

Figure 3:
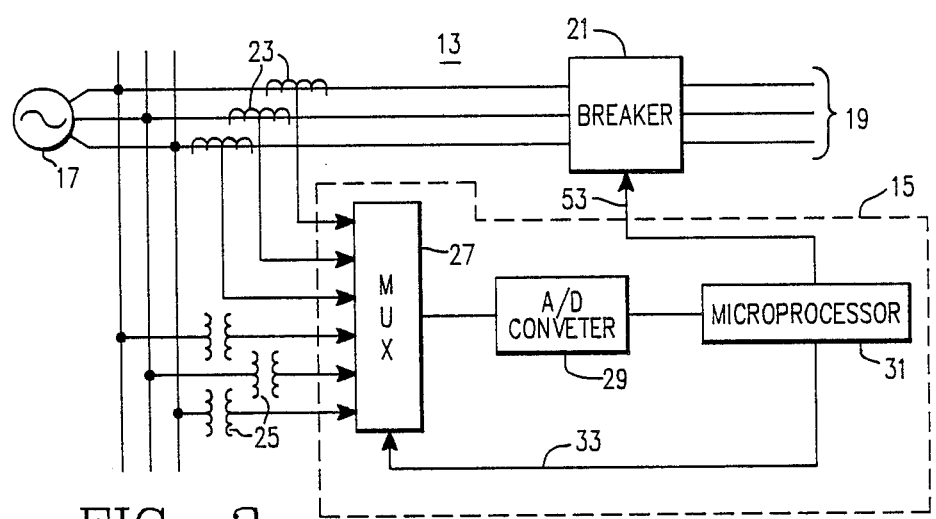
FIG. 3 is a schematic diagram of an electric power transmission system including a digital distance measuring relay incorporating the invention.

FIG. 3 illustrates an electric power transmission system 13 with a distance measuring relay 15 incorporating the invention. The electric power transmission system 13 includes a three-phase generator 17 feeding a three-phase transmission line 19. The transmission line 19 can be isolated from the generator 17 by tripping of a circuit breaker 21 which is controlled by the distance measuring relay 15.

Current transformers 23 generate signals proportional to the three phase currents in the transmission line 19 for use by the distance measuring relay 15. Similarly, potential transformers 25 provide signals proportional to the line voltages. A multiplexer 27 within the relay 15 serially applies the analog signals from the current and potential transformers to an analog to digital converter 29 which generates digital samples of the instantaneous values of the currents and voltages.

A microprocessor 31 in the distance measuring relay 15, controls the multiplexer 27 through control signals 33 to sequentially apply the analog signals to the analog to digital converter 29 at a rate which produces a plurality of digital samples of each of the currents and voltages at instants spaced by equal intervals of time during each power cycle.

Figure 4:
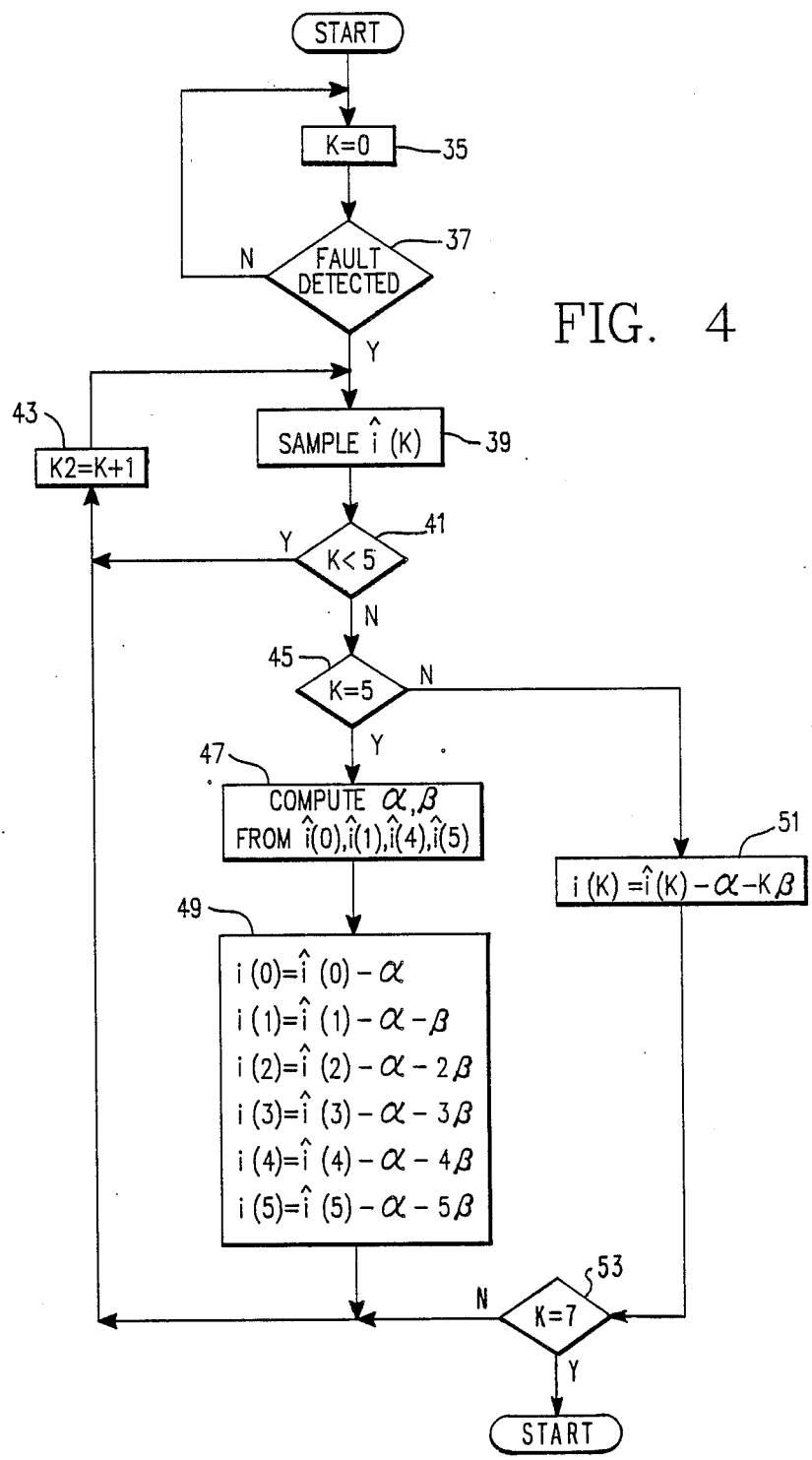
FIG. 4 is a flow diagram of a program for the digital distance measuring relay in the electric power transmission system of FIG. 3 implementing the invention.

The microprocessor 31 processes the digital samples in accordance with the invention to reduce the effects of the transient exponential noise. A flow chart of a program which performs this task is illustrated in FIG. 4. At program entry, the sample number, K, is initialized at zero as indicated at 35. When a fault has been detected at 37 by other programs run by the microprocessor, the first six digital samples (K=0 to K=5) are gathered as indicated by the loop which includes blocks 39, 41 and 43. Upon receipt of the sixth digital sample as determined at 45, $\alpha$ and $\beta$ are calculated at 47 from equations (12) and (13) above using, in the case of a current, î(0), î(1), î(4) and î(5). The first six compensated values of the waveform are then calculated from $\alpha$ and $\beta$ and the appropriate digital signals at 49. Thus, in just one-half power cycle plus one sample, compensated values of more than one-half cycle of the waveform are available for the other functions of the digital relay.

When the remaining samples are read, and K is equal to more than five at 45, the compensated values of the waveform are calculated at 51. After 8 samples, spanning a full power cycle, have been calculated at 52, a new linear approximation of the exponential component is calculated for the next cycle. These calculations are made for each of the currents and voltages in the transmission line.

As mentioned, the microprocessor 15 runs other programs using the compensated current and voltage waveforms to, among other things, detect fault inception, determine the apparent impedance to the fault, and make trip decisions. The trip signal 53 operates the breaker 21 to disconnect the transmission line 19 from the generator 17.

As will be appreciated from the above, a half-cycle of digital samples with the transient offset removed are available through the invention within one-half cycle plus one sampling interval after fault inception. This allows the distance relay to make accurate trip decisions sooner than has previously been possible.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for reducing transient exponential noise in sinusoidal current and voltage signals in a power transmission network following inception of a fault comprising:

means for generating a plurality of asynchronous digital samples of instantaneous values of at least a selected one of said current and voltage signals at instants spaced by equal intervals of time during each cycle of said at least selected one of said currents and voltages;

means determining from said digital samples a slope and initial ordinate value of a linear approximation of the transient exponential noise; and means calculating from said slope and initial ordinate value the value of the linear approximation of said transient exponential noise for each digital sample and subtracting the value of said linear approximation for each digital sample from the magnitude of the digital sample to generate a digital signal representative of the at least said selected one of said currents and voltages with said transient exponential noise reduced.

2. The apparatus of claim I wherein the means for determining the slope and initial ordinate value of the linear approximation of said transient exponential noise in said at least selected one of said current and voltage signals includes means adding the magnitudes of each of a first pair of digital samples for instants spaced from each other by one-half cycle of the at least selected on of said current and voltage signals to produce a sum, subtracting from said sum the magnitudes of each of a second pair of said digital samples for instants spaced from each other by one-half cycle, and spaced from a corresponding one of said first pair to digital samples by a preselected number of said intervals to produce a result, and dividing the result by minus twice the time between corresponding digital samples in said first and second pair of digital samples to determine the slope.

3. The apparatus of claim 2 wherein said means for determining the slope and initial ordinate value of said linear approximation of the transient exponential noise includes means calculating an average of the magnitudes of the first pair of digital samples and adding to that average the sum of the magnitudes of the first pair of digital samples minus the sum of the magnitudes of the second pair of digital samples divided by the number of intervals between corresponding samples in the first and second pairs of samples to determine the initial ordinate value.

4. The apparatus of claim 1 wherein said means for determining the slope and initial ordinate value of said linear approximation of said transient exponential noise includes means for adding the magnitudes of a first pair of digital samples spaced one-half of a cycle of the selected at least one of said currents and voltages apart, subtracting the magnitudes of each of a second pair of digital samples also spaced one-half cycle apart and spaced from corresponding ones of the first pair of digital samples by one interval and dividing by minus twice the interval of time between corresponding digital samples in the two pairs of digital samples to determine the slope.

5. The apparatus of claim 4 wherein the means for determining the slope and initial ordinate value of said linear approximation includes means for multiplying the sum of the magnitudes of the first pair of digital samples by three halves and subtracting the sum of the magnitudes of the second pair of digital samples to determine the initial ordinate value.

6. A method of reducing transient exponential noise from a analog sinusoidal electrical signal comprising the steps of:

generating a plurality of asynchronous digital samples of instantaneous values of the sinusoidal electrical signal at instants spaced by equal intervals of time during each cycle of the waveform; and programming a digital processor to:

determine a slope of a linear approximation of an exponential component of the transient exponential noise from the relationship:

$$\beta = \frac{\hat{w}(k) + \hat{w}\left(k + \frac{n}{2}\right) - \hat{w}(k + x) - \hat{w}\left(k + \frac{n}{2} + x\right)}{2\Delta}$$

where $\beta$ equals the slope, $\hat{w}$ is the magnitude of the digital sample of the waveform, K is the number of the sample, n is the number of samples per cycle of the waveform, $\Delta$ is the time interval between samples and X is the number of intervals between a first and second pair of digital samples each of which comprise two samples one-half cycle apart, determine an initial ordinate value of the linear approximation from a relationship:

$$\alpha = \frac{\hat{w}(k) + \hat{w}\left(k + \frac{n}{2}\right)}{2} + \frac{\left[\hat{w}(k) + \hat{w}\left(k + \frac{n}{2}\right) - \hat{w}(k + x) - \hat{w}\left(k + \frac{n}{2} + x\right)\right]}{x}$$

where $\alpha$ is the initial ordinate value;

determine a compensated value for each digital sample from the relationship:

$$w(k) = \hat{w}(k) - \alpha - K\beta$$

where w(k) is the compensated value of the th digital sample; and generate a digital electrical signal corresponding to the analog electrical signal but with the transient exponential noise reduced from said digital samples with compensated values.

* * * * *